United States Patent
Stolpman et al.

(10) Patent No.: US 7,689,892 B2
(45) Date of Patent: Mar. 30, 2010

(54) SYSTEM AND METHOD FOR ADAPTIVE LOW-DENSITY PARITY-CHECK (LDPC) CODING

(75) Inventors: Victor Stolpman, Dallas, TX (US); Tejas Bhatt, Irving, TX (US); Nico van Waes, Keller, TX (US); Jian Zhong Zhang, Irving, TX (US); Amitabh Dixit, Richardson, TX (US)

(73) Assignee: Nokia Corporation, Espoo (FI)

( * ) Notice: Subject to any disclaimer, the term of this patent is extended or adjusted under 35 U.S.C. 154(b) by 431 days.

(21) Appl. No.: 11/574,792

(22) PCT Filed: Sep. 7, 2005

(86) PCT No.: PCT/IB2005/002653

§ 371 (c)(1),
(2), (4) Date: Jul. 27, 2007

(87) PCT Pub. No.: WO2006/027668

PCT Pub. Date: Mar. 16, 2006

(65) Prior Publication Data

US 2008/0022191 A1    Jan. 24, 2008

(51) Int. Cl.
*H03M 13/00* (2006.01)
(52) U.S. Cl. .................. 714/774; 714/750; 714/751
(58) Field of Classification Search ............. 714/774, 714/751, 750
See application file for complete search history.

(56) References Cited

U.S. PATENT DOCUMENTS 6,567,465 B2 * 5/2003 Goldstein et al. ........... 375/222
6,633,856 B2 * 10/2003 Richardson et al. ........... 706/15
6,847,760 B2 * 1/2005 Argon et al. ................ 385/28
7,020,829 B2 * 3/2006 Eroz et al. ................. 714/794
7,058,873 B2 * 6/2006 Song et al. ................. 714/752
7,068,729 B2 * 6/2006 Shokrollahi et al. ......... 375/296
7,213,197 B2 * 5/2007 Jacobsen et al. ............ 714/800

(Continued)

FOREIGN PATENT DOCUMENTS

EP    1 401 140 A    3/2004

(Continued)

OTHER PUBLICATIONS

Dong-U, Lee et al., A Flexible Hardware Encoder for Low-Density Parity-Check Codes, Field-Programmable Custom Computing Machines, Apr. 20, 2004, pp. 1-11.

(Continued)

*Primary Examiner*—Esaw T Abraham
(74) *Attorney, Agent, or Firm*—Alston & Bird LLP

(57) ABSTRACT

A method of adaptive error correction coding includes processing data during a connection between a transmitting entity and a receiving entity, where the data is processed in accordance with a predetermined coding scheme. More particularly, processing data includes encoding one or more sequences received by an error correction encoder of the transmitting entity, or decoding one or more block codes received by an error correction decoder of the receiving entity. During the connection, then, the method includes selecting or receiving a selection of feedback code information. Thus, during at least a portion of the connection, the data processing is switched to processing data in accordance with a parity-check coding technique based upon the feedback code information.

25 Claims, 8 Drawing Sheets

U.S. PATENT DOCUMENTS

2002/0042899 A1* 4/2002 Tzannes et al. ............. 714/786
2004/0098659 A1 5/2004 Bjerke et al.
2004/0260998 A1 12/2004 Sutskover

FOREIGN PATENT DOCUMENTS

EP 1422829 A2 5/2004

OTHER PUBLICATIONS

Stolpman et al., Irregular Structured LDPC Codes, IEEE 802.16 Broadband Wireless Access Working Group, Aug. 17, 2004, pp. 1-7.

Hayasaka M. et al., Cell Loss Recovery Using Adaptive LDPC-Based FEC Method for Real Time Services Over Best Effort Networks, Communications, Aug. 1, 2004, pp. 504-508.

Yuling et al., Adaptive LDPC For Rayleigh Fading Channel, Computers And Communications, Jun. 28, 2004, pp. 651-656.

Dholakia, A. et al., "Rate-compatible low-density parity-check codes for digital subscriber lines", Proc. 2004 IEEE International Conference on Communications, Jun. 20, 2004, pp. 415-419.

* cited by examiner

SYSTEM AND METHOD FOR ADAPTIVE LOW-DENSITY PARITY-CHECK (LDPC) CODING

FIELD

The present invention generally relates to parity-check codes for encoding and decoding transmissions, and more particularly relates to block coding techniques such as low-density parity-check (LDPC) coding techniques.

BACKGROUND

Low-density parity-check (LDPC) codes have recently been the subject of increased research interest for their enhanced performance on additive white Gaussian noise (AWGN) channels. As described by Shannon's Channel Coding Theorem, the best performance is achieved when using a code consisting of very long codewords. In practice, codeword size is limited in the interest of reducing complexity, buffering, and delays. LDPC codes are block codes, as opposed to trellis codes that are built on convolutional codes. LDPC codes constitute a large family of codes including turbo codes. Block codewords are generated by multiplying (modulo 2) binary information words with a binary matrix generator. LDPC codes use a check parity matrix H, which is used for decoding. The term low density derives from the characteristic that the check parity matrix has a very low density of non-zero values, making it a relatively low complexity decoder while retaining good error protection properties.

The parity check matrix H measures $(N-K) \times N$, wherein N represents the number of elements in a codeword and K represents the number of information elements in the codeword. The matrix H is also termed the LDPC mother code. For the specific example of a binary alphabet, N is the number of bits in the codeword and K is the number of information bits contained in the codeword for transmission over a wireless or a wired communication network or system. The number of information elements is therefore less than the number of codeword elements, so $K<N$. FIGS. 1$a$ and 1$b$ graphically describe an LDPC code. The parity check matrix 10 of FIG. 1$a$ is an example of a commonly used 512×4608 matrix, wherein each matrix column 12 corresponds to a codeword element (variable node of FIG. 1$b$) and each matrix row 14 corresponds to a parity check equation (check node of FIG. 1$b$). If each column of the matrix H includes exactly the same number m of non-zero elements, and each row of the matrix H includes exactly the same number k of non-zero elements, the matrix represents what is termed a regular LDPC code. If the code allows for non-uniform counts of non-zero elements among the columns and/or rows, it is termed an irregular LDPC code.

Irregular LDPC codes have been shown to significantly outperform regular LDPC codes, which has generated renewed interest in this coding system since its inception decades ago. The bipartite graph of FIG. 1$b$ illustrates that each codeword element (variable nodes 16) is connected only to parity check equations (check nodes 18) and not directly to other codeword elements (and vice versa). Each connection, termed a variable edge 20 or a check edge 22 (each edge represented by a line in FIG. 1$b$), connects a variable node to a check node and represents a non-zero element in the parity check matrix H. The number of variable edges connected to a particular variable node 16 is termed its degree, and the number of variable degrees 24 are shown corresponding to the number of variable edges emanating from each variable node. Similarly, the number of check edges connected to a particular check node is termed its degree, and the number of check degrees 26 are shown corresponding to the number of check edges 22 emanating from each check node. Since the degree (variable, check) represents non-zero elements of the matrix H, the bipartite graph of FIG. 1$b$ represents an irregular LDPC code matrix. The following discussion is directed toward irregular LDPC codes since they are more complex and potentially more useful, but may also be applied to regular LDPC codes with normal skill in the art.

Conventional LDPC coding techniques often operate based upon assumptions on channel models (e.g., additive white Gaussian noise (AWGN) channel, binary erasure channel (BEC), etc.) to design code ensembles. Likewise, decisions on implementation tradeoffs with respect to the design of the parity-check matrices are typically made well in advance before solutions are delivered and cannot be easily changed after a standard specifies the transmitter characteristics. As new applications arise, however, new channels may be encountered to which legacy code ensembles may no longer apply. Likewise, hardware and system requirements may change with the new applications such that inefficiencies arise in the receiver and the communication system.

SUMMARY

In view of the foregoing background, exemplary embodiments of the present invention provide an improved system and method for error correction coding during a connection between a transmitting entity and a receiving entity. In this regard, exemplary embodiments of the present invention provide a closed-loop system and method for adaptive error correction coding capable of adapting the parity-check matrix or error correction code based upon which error correction coding is performed. The parity-check matrix can be constructed from feedback code information, which can be selected or otherwise constructed based upon one or more parameters having a relationship to the parity-check matrix. In this regard, the feedback code information can be selected based upon one or more parameters that are capable of changing in response to changes to feedback code information, and thus the parity-check matrix. Accordingly, exemplary embodiments of the present invention may provide for future compatibility and support for standard evolutions, as well as receiving entity differentiation based on different requirements, such as for one or more of those parameter(s) upon which the feedback code information can be selected. Exemplary embodiments of the present invention may also permit code adaptation for different channels to thereby improve system resource efficiency. In addition, exemplary embodiments of the present invention may permit receiving entities to customize power consumption and decoder architecture for different classes of devices that operate using a related standard.

According to one aspect of the present invention, a method is provided that can include processing data during a connection between a transmitting entity and a receiving entity, where the data is processed in accordance with a predetermined coding scheme. More particularly, processing data can include encoding one or more sequences received by an error correction encoder of the transmitting entity, or decoding one or more block codes received by an error correction decoder of the receiving entity. During the connection, then, the method can include selecting or receiving a selection of feedback code information. Thus, during at least a portion of the connection, the data processing can be switched to processing data in accordance with a parity-check coding technique based upon the feedback code information.

The feedback code information can comprise any of a number of different pieces of information from which a parity-check matrix is capable of being constructed. For example, the feedback code information can comprise a seed parity-check matrix, an exponent matrix, an index of a parity-check-matrix-related permutation matrix, or an index of an exponent-matrix-related permutation matrix. The feedback code information can be selected in a number of different manners, such as based upon one or more parameters having a relationship to a parity-check matrix with which the data is capable of being processed. For example, the feedback code information can be selected based upon the error performance, power consumption and/or architecture of the receiving entity, or more particularly the error correction decoder of the receiving entity.

The predetermined coding scheme from which the data processing switches can comprise any of a number of different coding schemes in accordance with exemplary embodiments of the present invention. For example, the predetermined coding scheme can include passing the data without processing the data. Alternatively, for example, the predetermined coding scheme can include processing the data in accordance with a second coding technique different from the parity-check coding technique. In another alternative, for example, the predetermined coding scheme can include processing the data in accordance with the parity-check coding technique based upon predefined code information different from the feedback code information.

According to other aspects of the present invention, a network entity, such as a transmitting entity and/or a receiving entity, and a computer program product are provided for adaptive error correction coding. Exemplary embodiments of the present invention therefore provide an improved network entity, method and computer program product. And as indicated above and explained in greater detail below, the network entity, method and computer program product of exemplary embodiments of the present invention may solve the problems identified by prior techniques and may provide additional advantages.

BRIEF DESCRIPTION OF THE DRAWINGS

Figure 1A:
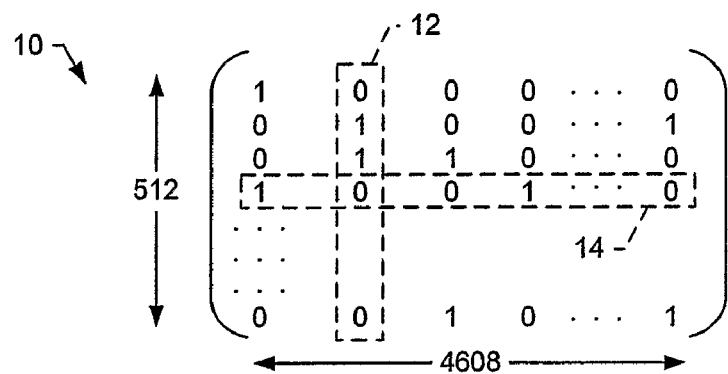
Figure 1B:
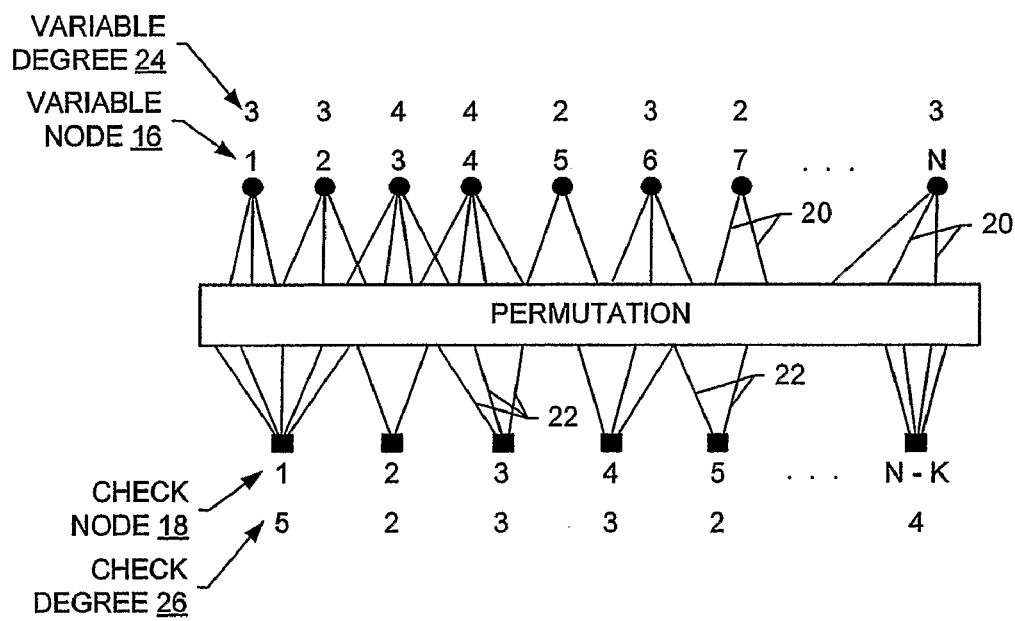
Figure 2:
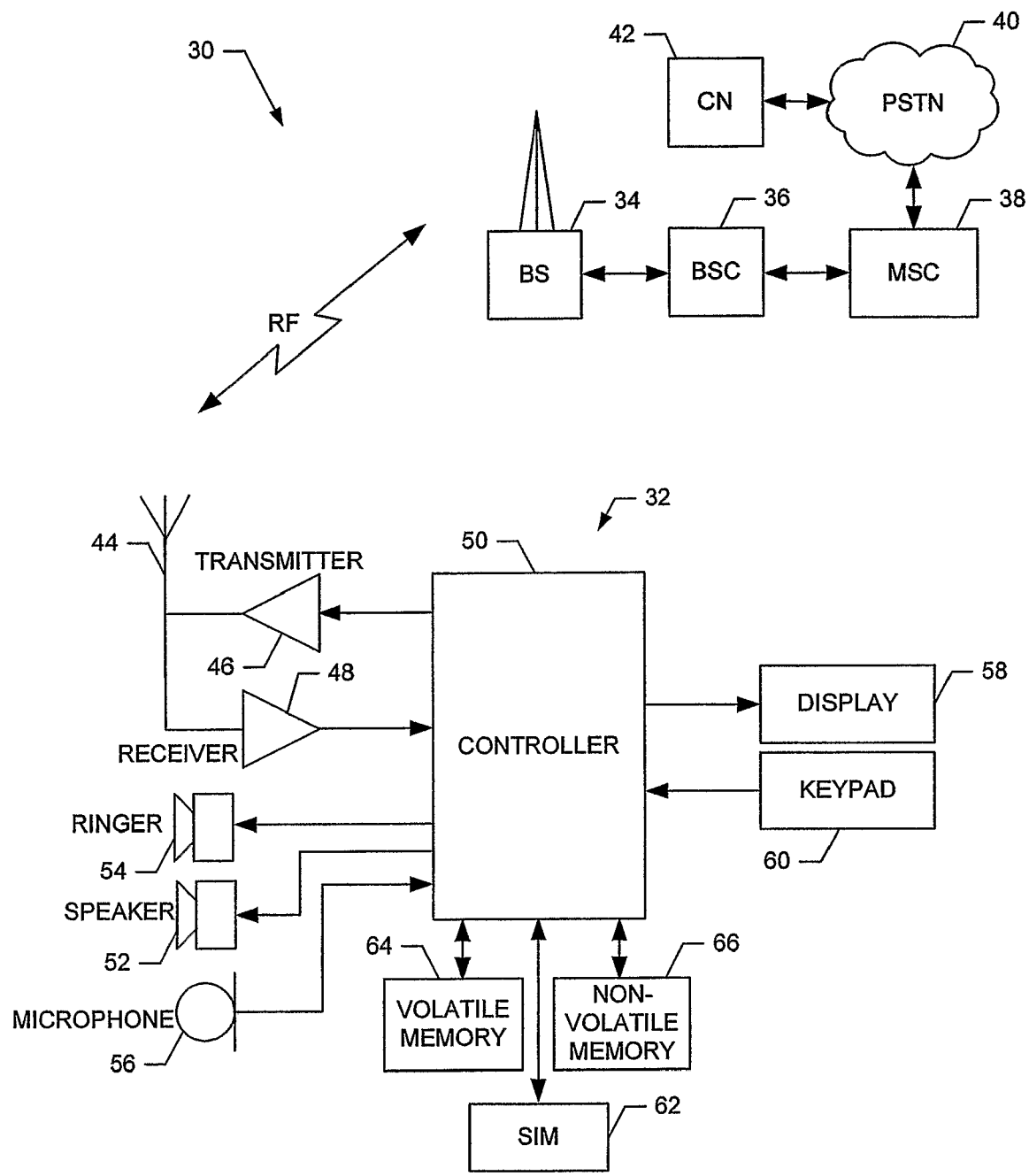
Figure 3:
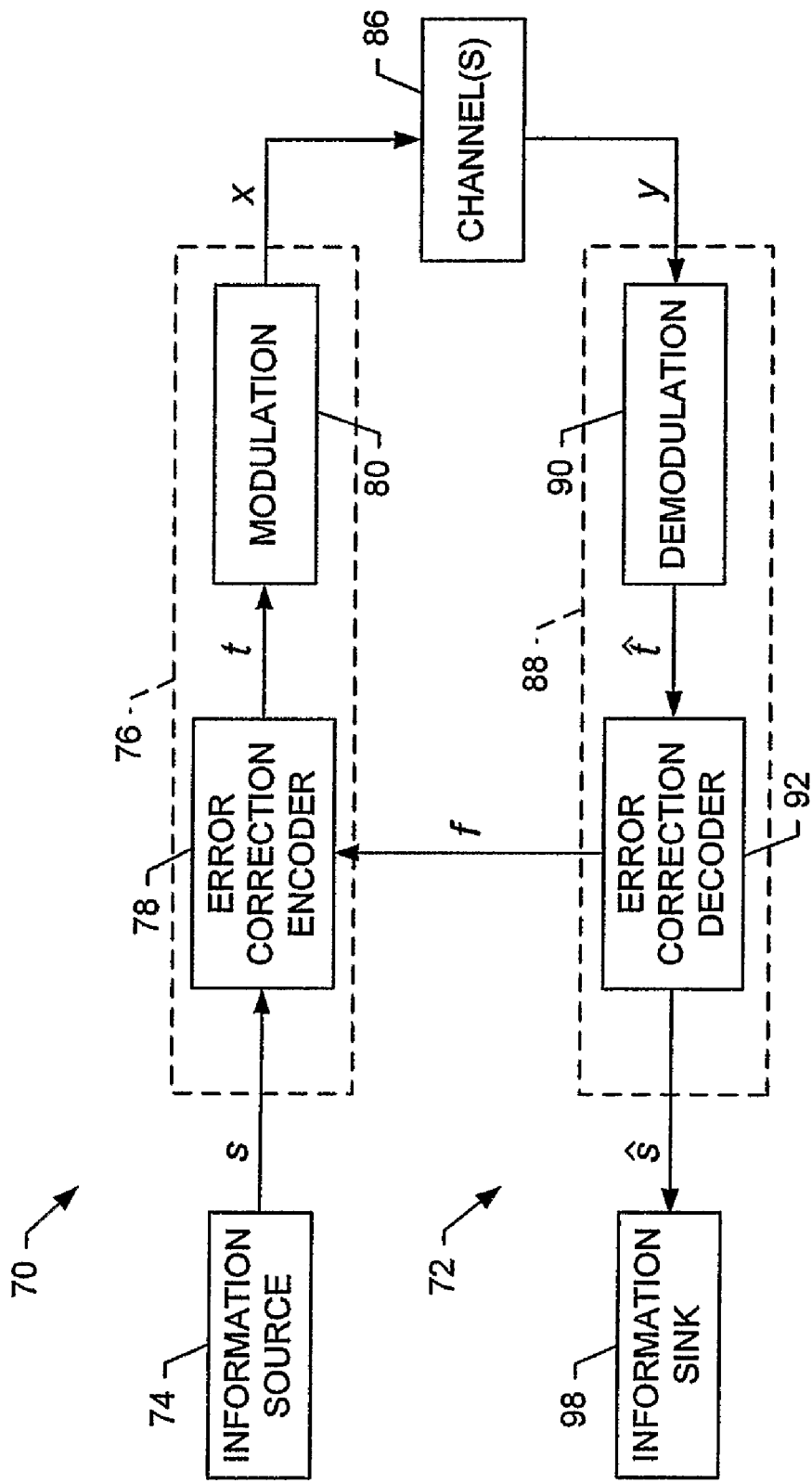
Figure 4:
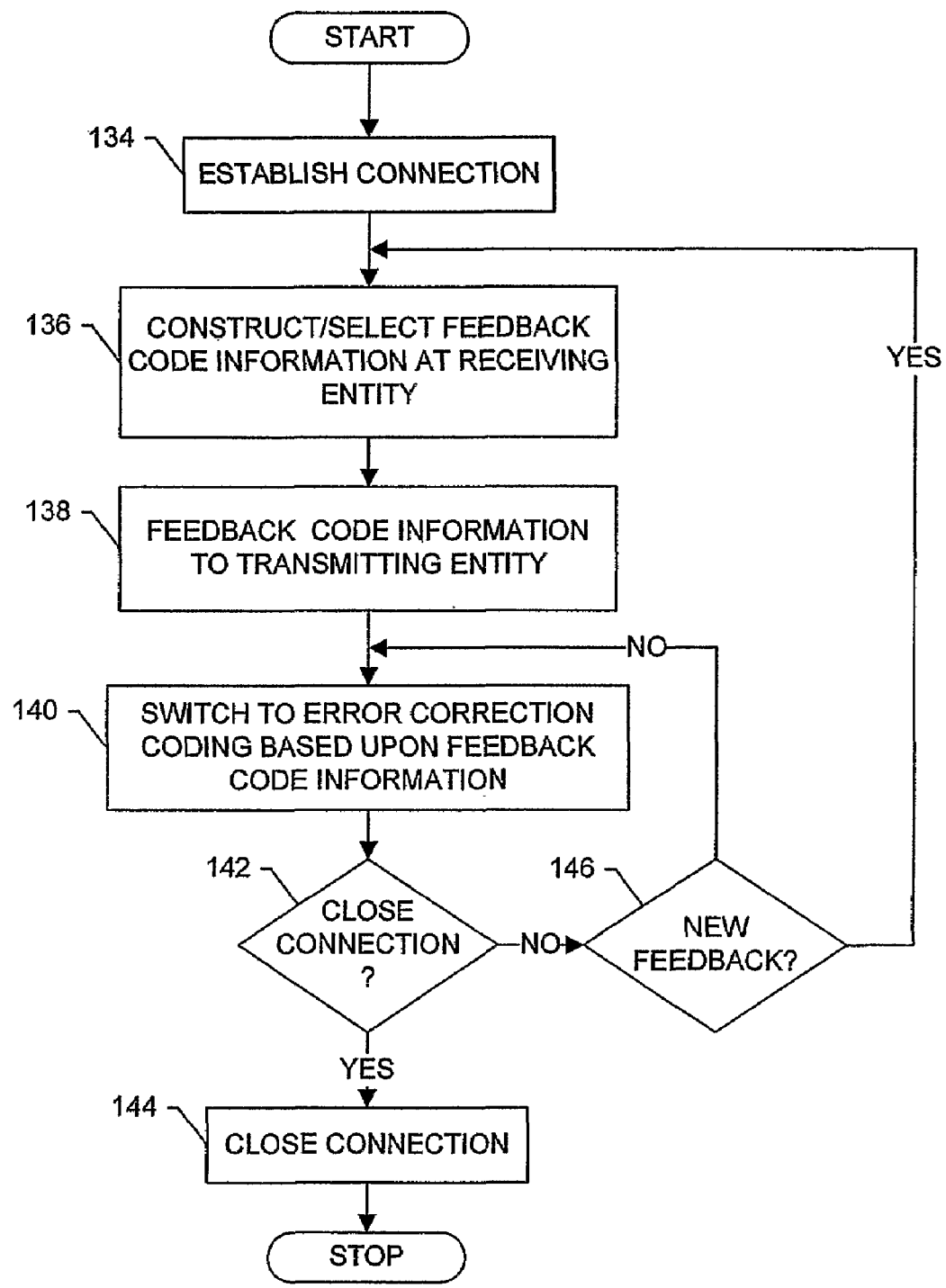
Figure 5B:
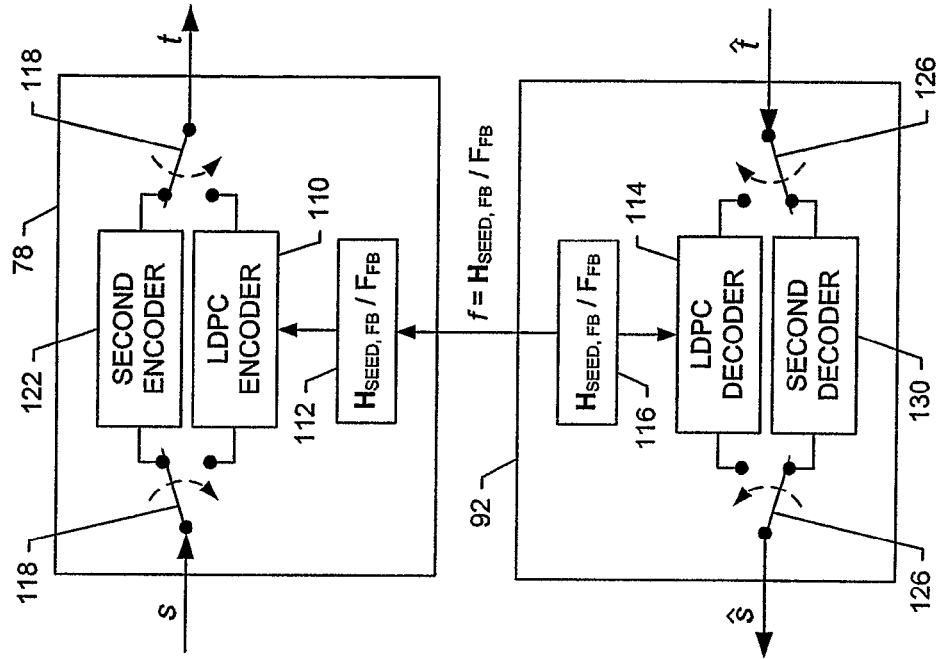
Figure 5A:
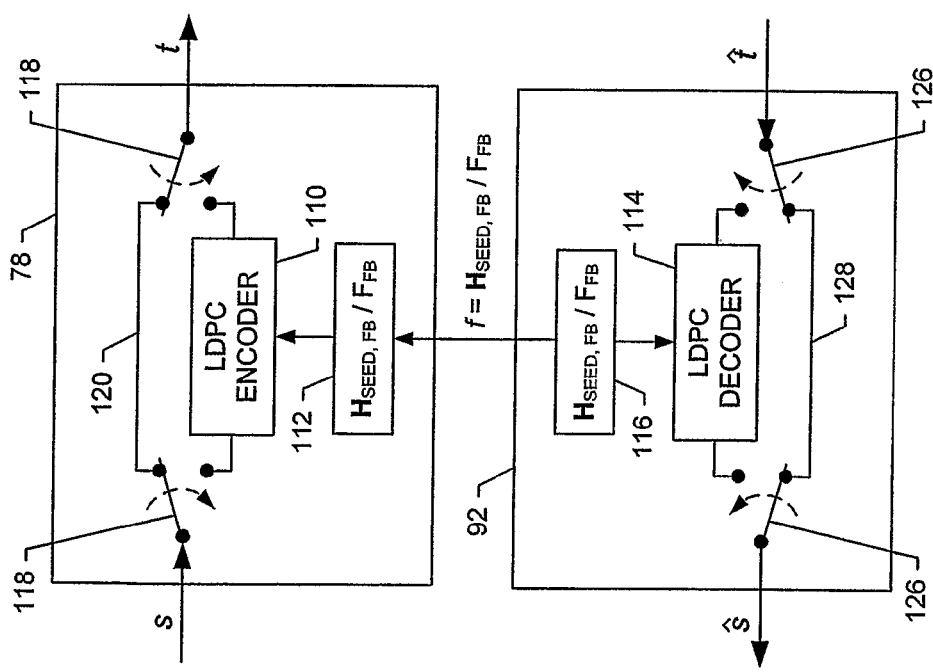
Figure 5C:
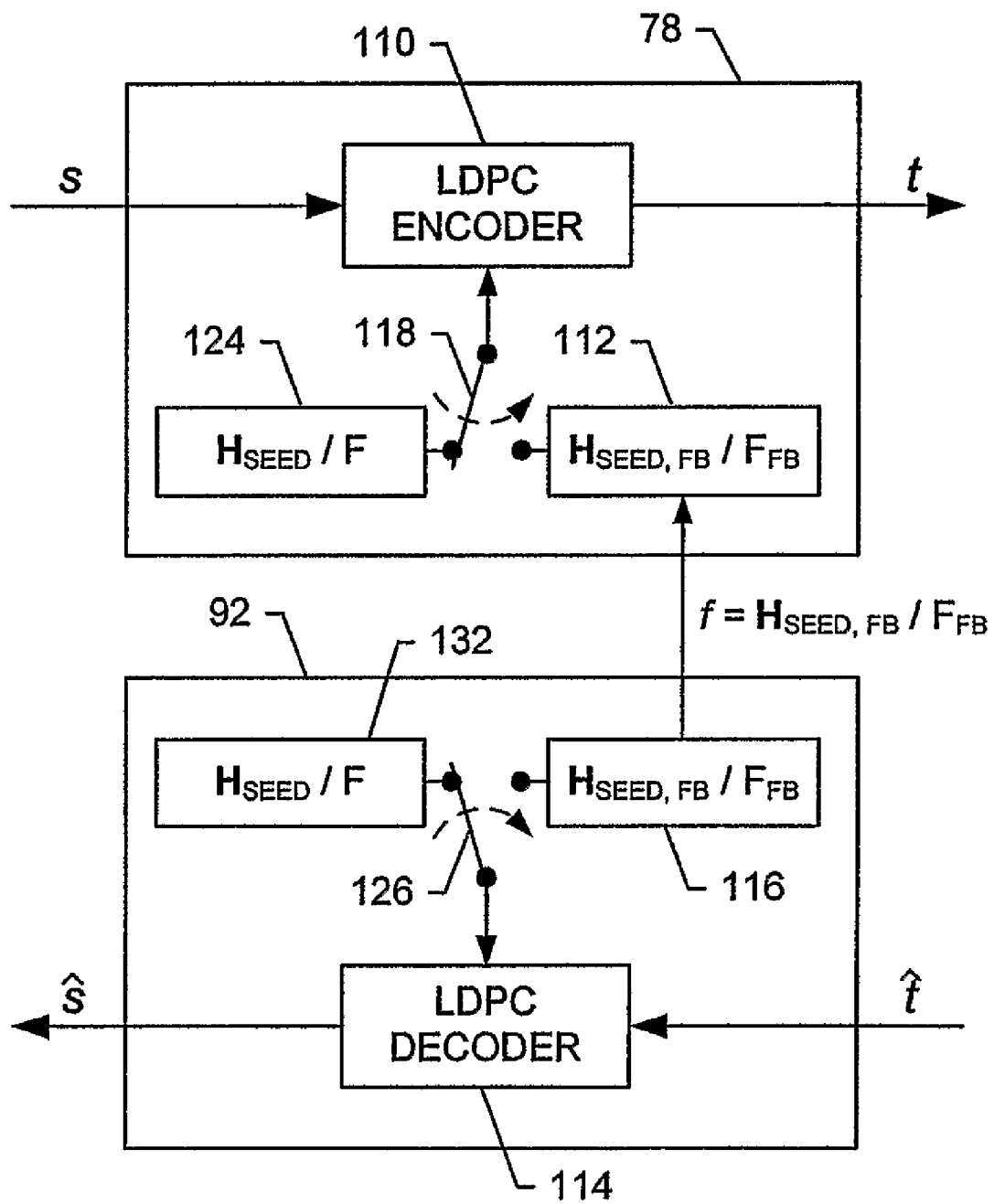
Figure 6A:
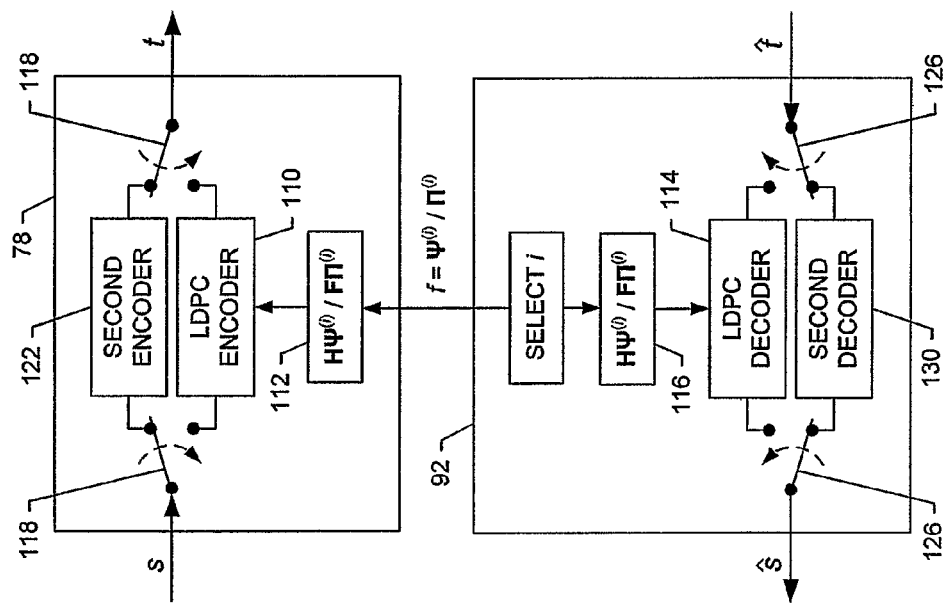
Figure 6B:
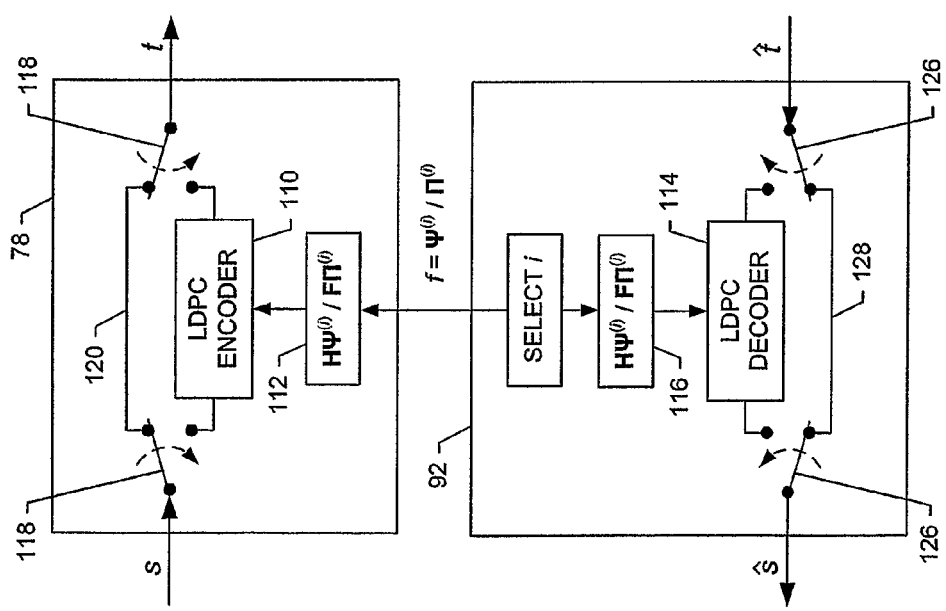
Figure 6C:
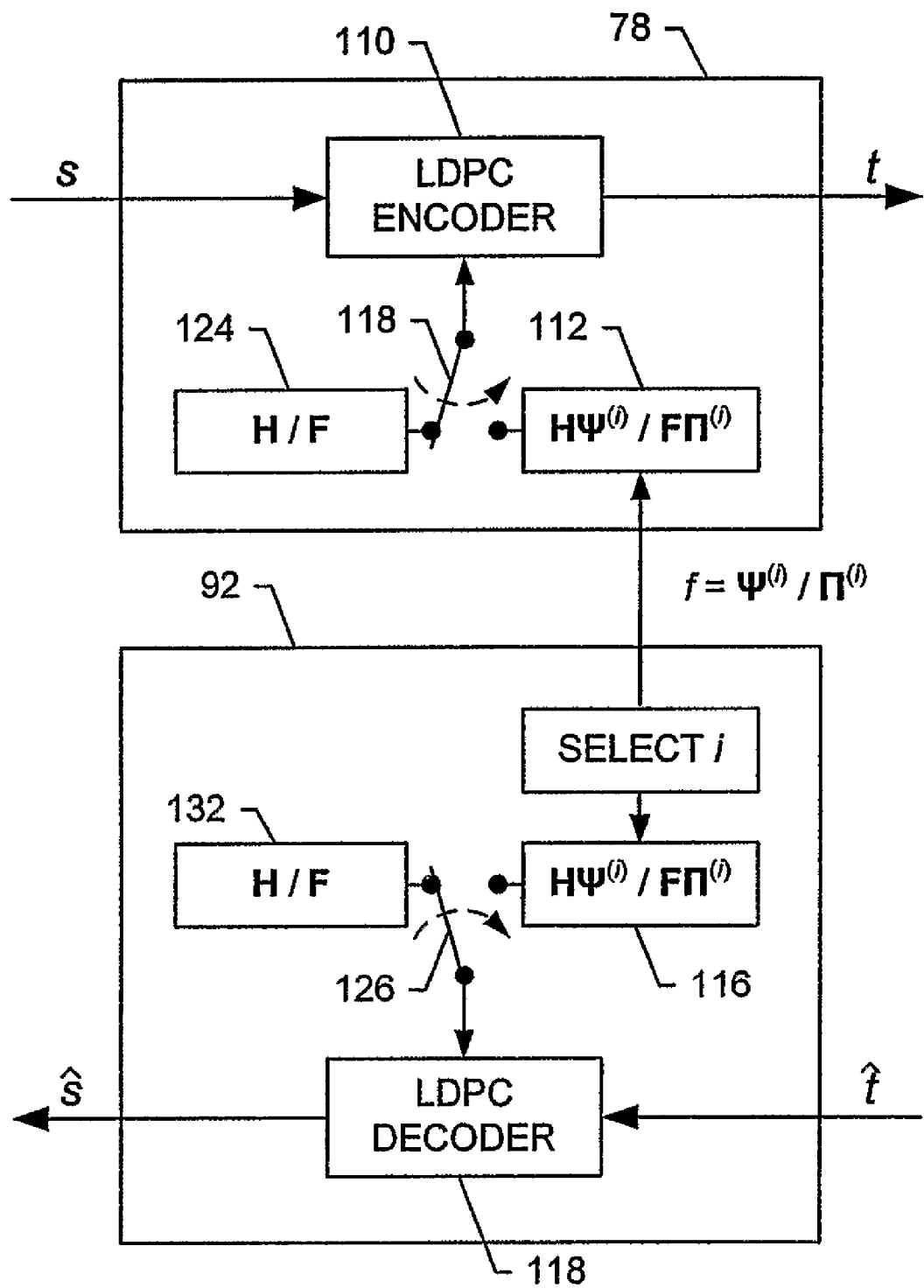

Having thus described the invention in general terms, reference will now be made to the accompanying drawings, which are not necessarily drawn to scale, and wherein:

FIG. 1a is a matrix of an exemplary low-density parity-check mother code, according to exemplary embodiments of the present invention;

FIG. 1b is a bipartite graph depicting connections between variable and check nodes, according to exemplary embodiments of the present invention;

FIG. 2 illustrates a schematic block diagram of a wireless communication system including a plurality of network entities, according to exemplary embodiments of the present invention;

FIG. 3 is a logical block diagram of a communication system according to exemplary embodiments of the present invention;

FIG. 4 is a flowchart illustrating various steps in a method of adaptive error correction coding according to exemplary embodiments of the present invention;

FIGS. 5a, 5b and 5c are functional block diagrams of an encoder and decoder performing adaptive error correction coding according to exemplary embodiments of the present invention; and FIGS. 6a, 6b and 6c are functional block diagrams of an encoder and decoder performing adaptive error correction coding according to other exemplary embodiments of the present invention.

DETAILED DESCRIPTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Referring to FIG. 2, an illustration of one type of wireless communications system 30 including a plurality of network entities, one of which comprises a terminal 32 that would benefit from embodiments of the present invention is provided. As explained below, the terminal may comprise a mobile telephone. It should be understood, however, that such a mobile telephone is merely illustrative of one type of terminal that would benefit from the present invention and, therefore, should not be taken to limit the scope of the present invention. While several exemplary embodiments of the terminal are illustrated and will be hereinafter described for purposes of example, other types of terminals, such as portable digital assistants (PDAs), pagers, laptop computers and other types of voice and text communications systems, can readily employ embodiments of the present invention. In addition, the system and method of embodiments of the present invention will be primarily described in conjunction with mobile communications applications. It should be understood, however, that the system and method of embodiments of the present invention can be utilized in conjunction with a variety of other applications, both in the mobile communications industries and outside of the mobile communications industries.

The communication system 30 provides for radio communication between two communication stations, such as a base station (BS) 34 and the terminal 32, by way of radio links formed therebetween. The terminal is configured to receive and transmit signals to communicate with a plurality of base stations, including the illustrated base station. The communication system can be configured to operate in accordance with one or more of a number of different types of spread-spectrum communication, or more particularly, in accordance with one or more of a number of different types of spread spectrum communication protocols. More particularly, the communication system can be configured to operate in accordance with any of a number of 1G, 2G, 2.5G and/or 3G communication protocols or the like. For example, the communication system may be configured to operate in accordance with 2G wireless communication protocols IS-95 (CDMA) and/or cdma2000. Also, for example, the communication system may be configured to operate in accordance with 3G wireless communication protocols such as Universal Mobile Telephone System (UMTS) employing Wideband Code Division Multiple Access (WCDMA) radio access technology. Further, for example, the communication system may be configured to operate in accordance with enhanced 3G wireless communication protocols such as 1X-EVDO (TIA/EIA/IS-856) and/or 1X-EVDV. It should be understood that operation of the exemplary embodiment of the present invention is similarly also possible in other types of radio, and other, communication systems. Therefore, while the following description may describe operation of an exemplary embodiment of the present invention with respect to the aforementioned wireless communication protocols, operation of an exemplary embodiment of the present invention can analogously be described with respect to any of various other types of wireless communication protocols, without departing from the spirit and scope of the present invention.

The base station 34 is coupled to a base station controller (BSC) 36. And the base station controller is, in turn, coupled to a mobile switching center (MSC) 38. The MSC is coupled to a network backbone, here a PSTN (public switched telephonic network) 40. In turn, a correspondent node (CN) 42 is coupled to the PSTN. A communication path is formable between the correspondent node and the terminal 32 by way of the PSTN, the MSC, the BSC and base station, and a radio link formed between the base station and the terminal. Thereby, the communications, of both voice data and non-voice data, are effectual between the CN and the terminal. In the illustrated, exemplary implementation, the base station defines a cell, and numerous cell sites are positioned at spaced-apart locations throughout a geographical area to define a plurality of cells within any of which the terminal is capable of radio communication with an associated base station in communication therewith.

The terminal 32 includes various means for performing one or more functions in accordance with exemplary embodiments of the present invention, including those more particularly shown and described herein. It should be understood, however, that the terminal may include alternative means for performing one or more like functions, without departing from the spirit and scope of the present invention. More particularly, for example, as shown in FIG. 2, in addition to one or more antennas 44, the terminal of one exemplary embodiment of the present invention can include a transmitter 26, receiver 48, and controller 50 or other processor that provides signals to and receives signals from the transmitter and receiver, respectively. These signals include signaling information in accordance with the communication protocol(s) of the wireless communication system, and also user speech and/or user generated data. In this regard, the terminal can be capable of communicating in accordance with one or more of a number of different wireless communication protocols, such as those indicated above. Although not shown, the terminal can also be capable of communicating in accordance with one or more wireline and/or wireless networking techniques. More particularly, for example, the terminal can be capable of communicating in accordance with local area network (LAN), metropolitan area network (MAN), and/or a wide area network (WAN) (e.g., Internet) wireline networking techniques. Additionally or alternatively, for example, the terminal can be capable of communicating in accordance with wireless networking techniques including wireless LAN (WLAN) techniques such as IEEE 802.11 (e.g., 802.11a, 802.11b, 802.11g, 802.11n, etc.), WiMAX techniques such as IEEE 802.16, and/or ultra wideband (UVB) techniques such as IEEE 802.15 or the like.

It is understood that the controller 50 includes the circuitry required for implementing the audio and logic functions of the terminal 32. For example, the controller may be comprised of a digital signal processor device, a microprocessor device, and/or various analog-to-digital converters, digital-to-analog converters, and other support circuits. The control and signal processing functions of the terminal are allocated between these devices according to their respective capabilities. The controller can additionally include an internal voice coder (VC), and may include an internal data modem (DM). Further, the controller may include the functionality to operate one or more client applications, which may be stored in memory (described below).

The terminal 32 can also include a user interface including a conventional earphone or speaker 52, a ringer 54, a microphone 56, a display 58, and a user input interface, all of which are coupled to the controller 38. The user input interface, which allows the terminal to receive data, can comprise any of a number of devices allowing the terminal to receive data, such as a keypad 60, a touch display (not shown) or other input device. In exemplary embodiments including a keypad, the keypad includes the conventional numeric (0-9) and related keys (#, *), and other keys used for operating the terminal. Although not shown, the terminal can include one or more means for sharing and/or obtaining data (not shown).

In addition, the terminal 32 can include memory, such as a subscriber identity module (SIM) 62, a removable user identity module (R-UIM) or the like, which typically stores information elements related to a mobile subscriber. In addition to the SIM, the terminal can include other removable and/or fixed memory. In this regard, the terminal can include volatile memory 64, such as volatile Random Access Memory (RAM) including a cache area for the temporary storage of data. The terminal can also include other non-volatile memory 66, which can be embedded and/or may be removable. The non-volatile memory can additionally or alternatively comprise an EEPROM, flash memory or the like. The memories can store any of a number of client applications, instructions, pieces of information, and data, used by the terminal to implement the functions of the terminal.

As described herein, the client application(s) may each comprise software operated by the respective entities. It should be understood, however, that any one or more of the client applications described herein can alternatively comprise firmware or hardware, without departing from the spirit and scope of the present invention. Generally, then, the network entities (e.g., terminal 32, BS 34, BSC 36, etc.) of exemplary embodiments of the present invention can include one or more logic elements for performing various functions of one or more client application(s). As will be appreciated, the logic elements can be embodied in any of a number of different manners. In this regard, the logic elements performing the functions of one or more client applications can be embodied in an integrated circuit assembly including one or more integrated circuits integral or otherwise in communication with a respective network entity or more particularly, for example, a processor or controller of the respective network entity. The design of integrated circuits is by and large a highly automated process. In this regard, complex and powerful software tools are available for converting a logic level design into a semiconductor circuit design ready to be etched and formed on a semiconductor substrate. These software tools, such as those provided by Avant! Corporation of Fremont, Calif. and Cadence Design, of San Jose, Calif., automatically route conductors and locate components on a semiconductor chip using well established rules of design as well as huge libraries of pre-stored design modules. Once the design for a semiconductor circuit has been completed, the resultant design, in a standardized electronic format (e.g., Opus, GDSII, or the like) may be transmitted to a semiconductor fabrication facility or "fab" for fabrication.

Reference is now made to FIG. 3, which illustrates a functional block diagram of the system 30 of FIG. 2 in accordance with one exemplary embodiment of the present invention. As shown, the system includes a pair of network entities, namely, a transmitting entity 70 (e.g., BS 34) and a receiving entity 72 (e.g., terminal 32), establishing and effectuating a connection over one or more channels 86. As shown and described below, the system and method of exemplary embodiments of the present invention are capable of performing error correction coding during at least a portion of a connection between the transmitting and receiving entities in accordance with a low-density parity-check (LDPC) coding technique using structured irregular LDPC codes. It should be understood, however, that the system and method of exemplary embodiments of the present invention may be equally applicable to performing error correction coding during at least a portion of the connection in accordance with a LDPC coding technique using unstructured (randomly constructed) and/or regular LDPC codes, without departing from the spirit and scope of the present invention. It should further be understood that the transmitting and receiving entities may be implemented into any of a number of different types of transmission systems that transmit coded or uncoded digital transmissions over a radio interface.

In the illustrated system, an information source 74 of the transmitting entity 70 can output a K-dimensional sequence of information bits s into a transmitter 76 that includes an error correction encoder 78 and modulation block 80. The error correction encoder includes means for selectively encoding or otherwise processing the sequence s into a codeword t (e.g., an, N-dimensional codeword) in accordance with a plurality of error correction techniques, such as convolutional coding, turbo coding, block coding and/or low-density parity-check (LDPC) coding techniques. Irrespective of the coding technique utilized by the error correction encoder of the transmitting entity, the transmitting entity can thereafter transmit the codeword t to the receiving entity 72 over one or more channels 86. Before the codeword is transmitted over the channel(s), however, the codeword t can be broken up into sub-vectors and provided to the modulation block 80, which can modulate and up-convert the sub-vectors to a vector x of the sub-vectors. The vector x can then be transmitted over the channel(s).

As the vector x is transmitted over the channel(s) 86 (or by virtue of system hardware), noise and other channel conditions can affect the vector so that a vector y is received by the receiving entity 72 and input into a receiver 88 of the receiving entity. The receiver can include a demodulation block 90 and an error correction decoder 92. The demodulation block can demodulate vector y, such as in a symbol-by-symbol manner, to thereby produce a hard-decision vector $\hat{t}$ on the received information vector t. The demodulation block can also calculate probabilities of the decision being correct, and then output the hard-decision vector and probabilities to the error correction decoder. The error correction decoder, then, can include means for decoding or otherwise processing the received block code into a decoded information vector $\hat{s}$, which can be output to an information sink 98. Similar to the error correction encoder 78, the error correction decoder can be capable of selectively decoding the block code in accordance with a plurality of error correction techniques.

At one or more instances during the connection between the transmitting entity 70 and the receiving entity 72, the error correction encoder 78 and decoder 92 can be capable of selectively encoding sequences and decoding block codes in accordance with a parity-check (e.g., LDPC) coding technique based upon coding information selected or otherwise constructed by the decoder, and fed back to the encoder. In this regard, the decoder can select/construct the code information in any of a number of different manners, such as based upon one or more system parameters having a relationship to the parity-check matrix with which the error correction encoder and/or decoder perform their respective functions.

For example, the decoder can be capable of selecting/constructing the code information based upon the error performance, power consumption and/or architecture of the decoder, where one or more of the system parameters (e.g., error performance) may be based upon the channel 86 between the transmitting and receiving entities. In this regard, parameters such as the error performance, power consumption and/or architecture of the decoder are capable of changing in response to changes in the feedback code information, and thus the parity-check matrix capable of being constructed therefrom.

A. Structured LDPC Codes

As shown and explained herein, the error correction encoder 78 and decoder 92 include means for selectively encoding/decoding signals in accordance with at least one coding technique comprising a LDPC coding technique. In such instances, the LDPC code utilized by the encoder/decoder for performing their respective functions can comprise an irregular structured LDPC code. The LDPC code, then, can be constructed in any of a number of different manners. For example, the LDPC code can be constructed from a "seed" LDPC code, or more particularly a "seed" parity-check matrix $H_{SEED}$, as explained below. In another alternative, the LDPC code can be constructed from an exponent matrix F, as also explained below.

1. Seed Matrix Construction

Construction of an irregular structured LDPC code in accordance with exemplary embodiments of the present invention can include constructing an irregular "seed" low-density parity check-matrix $H_{SEED}$. The constructed irregular seed low-density parity check-matrix $H_{SEED}$ can comprise a matrix of dimension $((N_{SEED}-K_{SEED}) \times N_{SEED})$, where $N_{SEED}$ and $K_{SEED}$ represent the number of elements and information elements, respectively, for a code defined by $H_{SEED}$. Although there are no limits on the maximum values of $K_{SEED}$ and $N_{SEED}$, such values can be selected to be relatively small in comparison to a target message-word and codeword length. Selecting $K_{SEED}$ and $N_{SEED}$ in this manner may allow for more potential integer multiples of $N_{SEED}$ within the target range of codeword lengths, reduced memory requirements, and simplified code descriptions. And as will be appreciated, the irregular seed low-density parity check-matrix $H_{SEED}$ can be constructed in any of a number of different manners, such as by deriving $H_{SEED}$ from an edge distribution defined by $\lambda_{SEED}(x)$ and $\rho_{SEED}(x)$, the edge distribution being selected for good asymptotic performance and good girth properties. In this regard, good asymptotic performance can be characterized by a good threshold value using belief propagation decoding, and good girth can be characterized by having very few if no variable nodes with a girth of four.

One function of the seed matrix $H_{SEED}$ can be to identify the location and type of sub-matrices in an expanded LDPC parity-check matrix H, matrix H being constructed from $H_{SEED}$ and a given set of permutation matrices, as explained below. In this regard, the permutation matrices in $H_{SEED}$ can determine the location of sub-matrices in the expanded matrix H that contain a permutation matrix of dimension $(N_{SPREAD} \times N_{SPREAD})$ from the given set. One selection within the given set of permutation matrices is defined below. For example, the given set of permutation matrices used herein can be finite and consist of the set:

$$\{P_{SPREAD}^{\infty}, P_{SPREAD}^{0}, P_{SPREAD}^{1}, P_{SPREAD}^{2}, \ldots, P_{SPREAD}^{p-1}\}$$

where p represents a positive integer (a prime number in one embodiment of the invention), $P_{SPREAD}^0=I$ represents the identity matrix, $P_{SPREAD}^1$ represents a full-rank permutation matrix, $P_{SPREAD}^2=P_{SPREAD}^1 P_{SPREAD}^1$, $P_{SPREAD}^3=P_{SPREAD}^1 P_{SPREAD}^1 P_{SPREAD}^1$, etc. up to $P_{SPREAD}^{p-1}$. More particularly, for example, $P_{SPREAD}^1$ can comprise the following single circular shift permutation matrix for $N_{SPREAD}=5$:

$$P_{SPREAD}^1 = \begin{bmatrix} 0 & 1 & 0 & 0 & 0 \\ 0 & 0 & 1 & 0 & 0 \\ 0 & 0 & 0 & 1 & 0 \\ 0 & 0 & 0 & 0 & 1 \\ 1 & 0 & 0 & 0 & 0 \end{bmatrix}$$

Alternatively, for example, $P_{SPREAD}^1$ can comprise the following alternate single circular shift permutation matrix for $N_{SPREAD}=5$:

$$P_{SPREAD}^1 = \begin{bmatrix} 0 & 0 & 0 & 0 & 1 \\ 1 & 0 & 0 & 0 & 0 \\ 0 & 1 & 0 & 0 & 0 \\ 0 & 0 & 1 & 0 & 0 \\ 0 & 0 & 0 & 1 & 1 \end{bmatrix}$$

In the preceding, $P_{SPREAD}^\infty$ represents the all zeros matrix $0$ of dimension ($N_{SPREAD} \times N_{SPREAD}$) (i.e., $P_{SPREAD}^\infty = 0$ where every element is a zero), and the zeros in $H_{SEED}$ indicate the location of the sub-matrix $P_{SPREAD}^\infty = 0$ in the expanded matrix H. Thus, the expanded LDPC matrix H can be of dimension ($N_{SPREAD}(N_{SEED}-K_{SEED}) \times N_{SPREAD}N_{SEED}$) with sub-matrices comprising permutation matrices of dimension ($N_{SPREAD} \times N_{SPREAD}$) raised to an exponential power from the set of $\{0, 1, \ldots, p-1, \infty\}$. In addition, the expanded LDPC code can have the same edge distribution as $H_{SEED}$ and can therefore achieve a desired asymptotic performance described by $\lambda_{SEED}(x)$ and $\rho_{SEED}(x)$, provided both $H_{SEED}$ and the expanded matrix H have satisfactory girth properties.

Before, after or as the matrix $H_{SEED}$ is constructed, a structured array exponent matrix $E_{ARRAY}$ can be constructed. As with the matrix $H_{SEED}$ the structured array exponent matrix can be constructed in any of a number of different manners. For example, the structured array exponent matrix can be constructed as follows:

$$E_{ARRAY} = \begin{bmatrix} E_{1,1} & E_{1,2} & \cdots & E_{1,p} \\ E_{2,1} & E_{2,2} & \cdots & E_{2,p} \\ \vdots & \vdots & \ddots & \vdots \\ E_{p,1} & E_{p,2} & \cdots & E_{p,p} \end{bmatrix}$$

where $E_{i,j}=(i-1)(j-1) \mod p$, although it should be understood that the modulo arithmetic of the value p need not be utilized. The value p can be selected in a number of different manners, but in one exemplary embodiment, p is a prime number. In addition, value p can be at least the column dimension of the matrix $H_{SEED}$ and the column dimension of the spreading permutation matrix. Further, it should be noted that $N_{SEED}$ and $N_{SPREAD}$ can be selected such that $N_{SEED} \leq p$ and $N_{SPREAD} \leq p$, although other values are possible.

After constructing the seed and structured array exponent matrices, $H_{SEED}$ and $E_{ARRAY}$, respectively, a final exponent matrix $F_{FINAL}$ can be constructed based upon those matrices in order to expand the seed matrix into H. Before constructing the final exponent matrix $F_{FINAL}$, however, the structured array exponent matrix $E_{ARRAY}$ can be transformed into matrix $T(E_{ARRAY})$ of dimension $((N_{SEED}-K_{SEED}) \times N_{SEED})$ such that the final exponent matrix $F_{FINAL}$ can be constructed from the transformation in lieu of the array exponent matrix. For example, the structured array exponent matrix $E_{ARRAY}$ can be transformed by shifting of rows to construct an upper triangular matrix while replacing vacated element locations with $\infty$, such as in the following manner:

$$E_{SHIFT} = \begin{bmatrix} E_{1,1} & E_{1,2} & E_{1,3} & \cdots & E_{1,p} \\ \infty & E_{2,1} & E_{2,1} & \cdots & E_{2,p-1} \\ \infty & \infty & E_{3,1} & \cdots & E_{3,p-2} \\ \vdots & \vdots & \vdots & \ddots & \vdots \\ \infty & \infty & \infty & \cdots & E_{p,1} \end{bmatrix}$$

Alternatively, the structured array exponent matrix $E_{ARRAY}$ can be transformed by truncating one or more columns and/or rows to select a sub-matrix of $E_{ARRAY}$ for implementation with a specified $H_{SEED}$. In yet another alternative, the structured array exponent matrix $E_{ARRAY}$ can be transformed by the combination of both shifting and truncation. For example, given $N_{SEED}+1 \leq p$ and $N_{SPREAD} \leq p$, $E_{ARRAY}$ can be transformed by both shifting and truncation as follows:

$$E_{TRUNCATE1} = \begin{bmatrix} E_{1,2} & E_{1,3} & E_{1,4} & \cdots & E_{1,(N_{SEED}-K_{SEED})} & \cdots & E_{1,(N_{SEED}+1)} \\ E_{2,1} & E_{2,2} & E_{2,3} & \cdots & E_{2,(N_{SEED}-K_{SEED}-1)} & \cdots & E_{2,N_{SEED}} \\ \infty & E_{3,1} & E_{3,2} & \cdots & E_{3,(N_{SEED}-K_{SEED}-2)} & \cdots & E_{3,(N_{SEED}-1)} \\ \vdots & \vdots & \vdots & \ddots & \vdots & \ddots & \vdots \\ \infty & \infty & \infty & \cdots & E_{(N_{SEED}-K_{SEED}),1} & \cdots & E_{(N_{SEED}-K_{SEED}),(K_{SEED}+2)} \end{bmatrix}$$

And for $N_{SEED}+2 \leq p$ and $N_{SPREAD} \leq p$, $E_{ARRAY}$ can be transformed by both shifting and truncation as follows:

$$E_{TRUNCATE2} = \begin{bmatrix} E_{2,2} & E_{2,3} & E_{2,4} & \cdots & E_{2,(N_{SEED}-K_{SEED})} & \cdots & E_{2,(N_{SEED}+1)} \\ E_{3,1} & E_{3,2} & E_{3,3} & \cdots & E_{3,(N_{SEED}-K_{SEED}-1)} & \cdots & E_{3,N_{SEED}} \\ \infty & E_{4,1} & E_{4,2} & \cdots & E_{4,(N_{SEED}-K_{SEED}-2)} & \cdots & E_{4,(N_{SEED}-1)} \\ \vdots & \vdots & \vdots & \ddots & \vdots & \ddots & \vdots \\ \infty & \infty & \infty & \cdots & E_{(N_{SEED}-K_{SEED}+1),1} & \cdots & E_{(N_{SEED}-K_{SEED}+1),(K_{SEED}+2)} \end{bmatrix}$$

As will be appreciated, then, transformation of the structured array exponent matrix $E_{ARRAY}$ can include shifting and/or truncating the matrix in any of a number of different manners, as well as column and row permutation transformations performed either prior to or after other individual transformations in a nested fashion. It should be understood, however, that this family of transformations may include an identity transformation. In one exemplary embodiment of the present invention, then, $T(E_{ARRAY})=E_{ARRAY}$.

Irrespective of if, and if so how, the structured array exponent matrix $E_{ARRAY}$ is transformed, the final exponent matrix $F_{FINAL}$ can be constructed therefrom. In this regard, the final exponent matrix $F_{FINAL}$ can be defined as follows:

$$F_{FINAL} = \begin{bmatrix} F_{1,1} & F_{1,2} & \cdots & F_{1,N_{SEED}} \\ F_{2,1} & F_{2,2} & \cdots & F_{2,N_{SEED}} \\ \vdots & \vdots & \ddots & \vdots \\ F_{(N_{SEED}-K_{SEED}),1} & F_{(N_{SEED}-K_{SEED}),2} & \cdots & F_{(N_{SEED}-K_{SEED}),N_{SEED}} \end{bmatrix}$$

where $F_{FINAL}$ can be of dimension $((N_{SEED}-K_{SEED}) \times N_{SEED})$. In this regard, $F_{FINAL}$ can be constructed by replacing each element in $H_{SEED}$ with a corresponding element (i.e. the same row and column) in the transformed structured array exponent matrix $T(E_{ARRAY})$ and by replacing each zero in $H_{SEED}$ with infinity (i.e., $\infty$). Thus, the elements of $F_{FINAL}$ can belong to the set $\{0,1,\ldots,p-1,\infty\}$ if modulo arithmetic is used in the construction of $E_{ARRAY}$.

After constructing the final exponent matrix $F_{FINAL}$, a final LDPC parity-check matrix H that describes the LDPC code can be constructed based upon the seed matrix $H_{SEED}$ and $F_{FINAL}$, such as by expanding $H_{SEED}$ using $F_{FINAL}$. In this regard, as indicated above, matrix $H_{SEED}$ of dimension $((N_{SEED}-K_{SEED}) \times N_{SEED})$ can be spread or otherwise expanded using the elements of the permutation matrix set:

$\{P_{SPREAD}^{\infty}, P_{SPREAD}^{0}, P_{SPREAD}^{1}, P_{SPREAD}^{2}, \ldots, P_{SPREAD}^{p-1}\}$ with elements of dimension $(N_{SPREAD} \times N_{SPREAD})$, such as into the following parity-check matrix H:

$$H = \begin{bmatrix} P_{SPREAD}^{F_{1,1}} & P_{SPREAD}^{F_{1,2}} & \cdots & P_{SPREAD}^{F_{1,N_{SEED}}} \\ P_{SPREAD}^{F_{2,1}} & P_{SPREAD}^{F_{2,2}} & \cdots & P_{SPREAD}^{F_{2,N_{SEED}}} \\ \vdots & \vdots & \ddots & \vdots \\ P_{SPREAD}^{F_{(N_{SEED}-K_{SEED}),1}} & P_{SPREAD}^{F_{(N_{SEED}-K_{SEED}),2}} & \cdots & P_{SPREAD}^{F_{(N_{SEED}-K_{SEED}),N_{SEED}}} \end{bmatrix}$$

where matrix H is of dimension $(N_{SPREAD}(N_{SEED}-K_{SEED}) \times N_{SPREAD}N_{SEED})$. In this regard, matrix H describes sub-matrices of dimension $(N_{SPREAD} \times N_{SPREAD})$ in the (i,j)th sub-matrix location including the permutation matrix $P_{SPREAD}$ raised to the $F_{i,j}$ power (i.e., $P_{SPREAD}^{F_{i,j}}$), where $F_{i,j}$ is the matrix element in the (i,j)th location of $F_{FINAL}$. For more information on such a method for constructing irregularly structured LDPC codes, see U.S. patent application Ser. No. 11/174,335, entitled: Irregularly Structured, Low Density Parity Check Codes, filed Jul. 1, 2005, the content of which is hereby incorporated by reference.

2. Exponent Matrix Construction

As an alternative to the construction of a parity check matrix H from a seed matrix $H_{SEED}$, a parity check matrix H may be constructed from an exponent matrix F. As such, as explained further below, if a receiving entity 72 feeds back an exponent matrix F, termed $F_{FB}$, the transmitting entity 70 can utilize the feedback matrix $F_{FB}$ to construct the parity check matrix H. Such an exponent matrix F and the construction of a parity matrix H therefrom is defined below, but it should be noted that the construction of the exponent matrix F need not depend upon a structured array exponent matrix $E_{ARRAY}$ or any transform or truncation of $E_{ARRAY}$, as described above.

As indicated above, an expanded LDPC matrix H of dimension $(N_{SPREAD}(N_{SEED}-K_{SEED}) \times N_{SPREAD}N_{SEED})$ can be constructed with sub-matrices including permutation matrices of dimension $(N_{SPREAD} \times N_{SPREAD})$ raised to an exponential power from the set of $\{0,1,\ldots,p-1,\infty\}$. Thus, an expanded LDPC matrix H may be defined as:

$$H = \begin{bmatrix} P_{SPREAD}^{F_{1,1}} & P_{SPREAD}^{F_{1,2}} & \cdots & P_{SPREAD}^{F_{1,N_{SEED}}} \\ P_{SPREAD}^{F_{2,1}} & P_{SPREAD}^{F_{2,2}} & \cdots & P_{SPREAD}^{F_{2,N_{SEED}}} \\ \vdots & \vdots & \ddots & \vdots \\ P_{SPREAD}^{F_{(N_{SEED}-K_{SEED}),1}} & P_{SPREAD}^{F_{(N_{SEED}-K_{SEED}),2}} & \cdots & P_{SPREAD}^{F_{(N_{SEED}-K_{SEED}),N_{SEED}}} \end{bmatrix}$$

where $F_{i,j} \in \{0,1,\ldots,p-1,\infty\}$ for $i=1,2,\ldots,(N_{SEED}-K_{SEED})$ and $j=1,2,\ldots,N_{SEED}$. In matrix form, then, a final exponent matrix may be defined as follows:

$$F = \begin{bmatrix} F_{1,1} & F_{1,2} & \cdots & F_{1,N_{SEED}} \\ F_{2,1} & F_{2,2} & \cdots & F_{2,N_{SEED}} \\ \vdots & \vdots & \ddots & \vdots \\ F_{(N_{SEED}-K_{SEED}),1} & F_{(N_{SEED}-K_{SEED}),2} & \cdots & F_{(N_{SEED}-K_{SEED}),N_{SEED}} \end{bmatrix}$$

and be of dimension $((N_{SEED}-K_{SEED}) \times N_{SEED})$. As indicated above and explained below, the receiving entity 72 can feed back an F matrix, termed $F_{FB}$, to the transmitting entity 70 for use thereby in its construction of H in the manner defined above. Further details regarding such an exponent matrix F and its use in the construction of a parity-check matrix H are provided by P. Joo, et al., *LDPC Coding for OFDMA PHY,* IEEE C802.16d-04/86r1 (May 2004), the contents of which are incorporated herein in their entirety.

B. Adaptive LDPC Coding

In accordance with exemplary embodiments of the present invention, the error correction encoder 78 and decoder 92 can include means for switching between a plurality of error correction coding techniques, such as convolutional coding, turbo coding, block coding and/or low-density parity-check (LDPC) coding techniques, during establishment and effectuation of a connection between the transmitting entity 70 and the receiving entity 72. Additionally or alternatively, the error correction encoder and decoder can be capable of switching between a plurality of error correction codes within a particular coding technique, such as by switching between a plurality of LDPC codes (i.e., parity-check matrices) within an LDPC coding technique. In this regard, reference is now made to FIGS. 4, 5a-5c and 6a-6c which illustrate a flowchart and functional block diagrams of an error correction encoder and decoder performing adaptive error correction coding in accordance with exemplary embodiments of the present invention.

As shown in FIGS. 5a-5c and 6a-6c, the error correction encoder 78 can include an LDPC encoder 110 capable of encoding the sequences s into N-dimensional codewords t in accordance with an LDPC coding technique based upon feedback code information f from the error correction decoder 92 from the receiving entity, where the feedback code information may be stored in memory 112 of the error correction encoder. Similarly, the error correction decoder can include an LDPC decoder 114 capable of decoding the block codes t̂ into decoded information vectors ŝ in accordance with an LDPC coding technique based upon the feedback code information f selected or otherwise constructed by the error correction decoder, where the feedback code information may be stored in memory 116 of the error correction decoder.

As also shown in FIGS. 5a-5c and 6a-6c, at one or more instances during the connection between the transmitting entity 70 and receiving entity 72, such as during establishment and initial effectuation of the connection, the error correction encoder 78 and decoder 92 can be capable of switching 118 between the LDPC encoder and an alternative, predetermined coding scheme. More particularly, as shown in FIGS. 5a and 6a, the encoder/decoder can be capable of switching 118, 126 between the LDPC encoder/decoder and an encoding/decoding bypass 120, 128 via which the error correction encoder/decoder are capable of passing the sequences/block codes without encoding/decoding the same. Alternatively, the encoder/decoder can be capable of switching between the LDPC encoder/decoder and a second encoder/decoder 122, 130 capable of encoding/decoding the sequences in accordance with another, second coding technique (i.e., coding technique other than an LDPC coding technique), as shown in FIGS. 5b and 6b. In another alternative, the encoder/decoder can be capable of switching between the feedback code information in memory 112 and predefined code information in memory 124, 132 of the encoder/decoder from which the LDPC encoder/decoder is capable of encoding/decoding sequences/block codes, as shown in FIGS. 5c and 6c. Such predefined code information can include, for example, one or more pieces of information such as a "seed" parity-check matrix $H_{SEED}$ or exponent matrix F from which a parity-check matrix H can be selected or otherwise constructed (see FIGS. 5a-c), or a parity-check matrix H itself (see FIGS. 6a-6c). Thus, at one or more instances during the connection between the transmitting and receiving entities, the error correction encoder/decoder can switch to or from the LDPC encoder/decoder operating based upon the feedback coding information.

Referring now to FIG. 4, a method of adaptive error correction coding in accordance with exemplary embodiments of the present invention can include establishing a connection between the transmitting entity 70 and the receiving entity 72, as shown in block 134. During establishment of the connection, the error correction encoder 78 and decoder 92 can be configured to process (encode and decode) data (sequences and block codes) in accordance with a predetermined coding scheme. For example, the encoder/decoder can be configured to pass the sequences/block codes without processing the sequences/block codes (see FIGS. 5a, 6a). Alternatively, for example, the encoder/decoder can be configured to encode/decode the sequences/block codes in accordance with a second coding technique different from an LDPC coding technique (see FIGS. 5b, 6b), or encode/decode the sequences/block codes in accordance with an LDPC coding technique based upon predefined code information in memory of the encoder/decoder (see FIGS. 5c, 6c).

During the connection between the transmitting entity 70 and the receiving entity 72, the error correction decoder 92 (or another entity in communication therewith) can select or otherwise construct feedback code information including one or more pieces of information from which a parity-check matrix H can be selected or otherwise constructed, as shown in block 136. Similar to predefined code information, for example, the feedback code information can include a feedback seed parity-check matrix $H_{SEED, FB}$ or exponent matrix $F_{FB}$ from which a parity-check matrix H can be selected or otherwise constructed, such as in the manners explained above (see FIGS. 5a-c). Alternatively, for example, the feedback code information can include an index of a parity-check-matrix-related permutation matrix $\Psi^{(i)}$ (or the matrix itself) or an index of an exponent-matrix-related permutation matrix $\Pi^{(i)}$ (or the matrix itself) from which a next parity-check matrix H or a next exponent matrix F can be constructed. In such instances, the next parity-check matrix or exponent matrix can be constructed as the product of the permutation matrix and a current parity-check matrix (i.e., $H=H\Psi^{(i)}$) or a current exponent matrix (i.e., $F=F\Pi^{(i)}$) (see FIGS. 6a-6c).

As indicated above, the error correction decoder 92 can select or otherwise construct the feedback code information in any of a number of different manners, such as based upon one or more system parameters having a relationship to a parity-check matrix H with which the error correction encoder 78 and/or decoder can perform their respective functions. For example, the feedback code information can be selected/constructed based upon the error performance, power consumption and/or architecture of the decoder. More particularly, for example, the feedback code information can be selected/constructed based upon channel state information, channel state statistics, and/or observed probability of error via check sum calculations and/or syndrome evaluation.

After selecting or otherwise constructing the feedback code information, the error correction decoder 92 can feed the feedback code information f back to the error correction encoder 78 of the transmitting entity 70, such as across a feedback channel therebetween, as shown in block 138. In response to the feedback code information, the error correction encoder and decoder can switch to error correction encoding and decoding, respectively, based upon the feedback code information, as shown in block 140. For example, when the encoder/decoder is bypassing or otherwise encoding/decoding sequences/block codes in accordance with a second coding technique (see FIGS. 5a, 5b and 6a, 6b), the encoder/decoder can be capable of switching to, and thereafter encoding/decoding the sequences/block codes in accordance with an LDPC coding technique. In such instances, the encoder/decoder can be capable of encoding/decoding the sequences/block codes based upon a parity-check matrix that can be constructed or otherwise selected based upon the feedback code information.

On the other hand, the error correction encoder 78 and decoder 92 may already be encoding and decoding the sequences and block codes in accordance with a LDPC coding technique based upon predefined code information (see FIGS. 5c, 6c). In such instances, the encoder/decoder can be capable of switching from the predefined code information to the feedback code information. The encoder/decoder can then encode/decode the sequences/block codes based upon the feedback code information. Generally, then, the encoder and decoder are capable of switching to an LDPC coding technique to encode and decode the sequences and block codes based upon the feedback code information, where a parity-check matrix for encoding and decoding the sequences and block codes is capable of being constructed based upon the feedback code information.

The error correction encoder 78 and decoder 92 can continue to operate based upon the feedback code information, such as until the connection between the transmitting entity 70 and receiving entity 72 is closed, as shown in blocks 142 and 144. At one or more instances during the connection, however, the decoder can decide to select or otherwise construct new feedback code information, as shown in block 144. During each such instance, then, the decoder can select or otherwise construct the next feedback code information and feed the next code information back to the encoder (see blocks 136 and 138). The encoder and decoder can then switch from encoding and decoding based upon the current feedback code information to encoding and decoding based upon the next feedback code information. In this manner, the system and method of exemplary embodiments of the present invention are capable of repeatedly adapting operation of the encoder and decoder to improve one or more system parameters, such as error performance and/or power consumption of the decoder.

As explained above, the feedback code information can include an index of a permutation matrix $\Psi^{(i)}$ or $\Pi^{(i)}$ (or the matrix itself) from which the next parity-check matrix H or exponential matrix F can be constructed. In such instances, the permutation matrix $\Psi^{(i)}$ or $\Pi^{(i)}$ can be of dimension (N×N) or ($N_{SEED} \times N_{SEED}$), respectively, where $\Psi^{(i)} \in \{\Psi^{(1)}, \Psi^{(2)}, \ldots, \Psi^{(L)}\}$ and $\Pi^{(i)} \in \{\Pi^{(1)}, \Pi^{(2)}, \ldots, \Pi^{(L)}\}$, where the set of permutation matrices may or may not include the identity matrix $I_{(N \times N)}$ as one of its L elements. Also in such instances, the error correction encoder 78 may or may not have prior knowledge of the set of permutation matrices $\Psi$ or $\Pi$. If the encoder does have such prior knowledge, the feedback code information may only indicate the index i of the selected matrix $\Psi^{(i)}$ or $\Pi^{(i)}$. If the encoder does not have such prior knowledge, however, the feedback code information may include information from which the encoder can construct the selected permutation matrix, such as the entire permutation matrix $\Psi^{(i)}$ or $\Pi^{(i)}$ or a reordering vector indicating the permutations on the columns of H or F, respectively.

According to one exemplary aspect of the present invention, the functions performed by one or more of the entities of the system, such as the terminal 32, BS 34 and/or BSC 36 including respective transmitting and receiving entities 70, 72 and, more particularly, the error correction encoder 78 and decoder 92, may be performed by various means, such as hardware and/or firmware, including those described above, alone and/or under control of one or more computer program products. The computer program product(s) for performing one or more functions of exemplary embodiments of the present invention includes at least one computer-readable storage medium, such as the non-volatile storage medium, and software including computer-readable program code portions, such as a series of computer instructions, embodied in the computer-readable storage medium.

In this regard, FIG. 4 is a flowchart of methods, systems and program products according to exemplary embodiments of the present invention. It will be understood that each block or step of the flowchart, and combinations of blocks in the flowchart, can be implemented by various means, such as hardware, firmware, and/or software including one or more computer program instructions. These computer program instructions may be loaded onto a computer or other programmable apparatus to produce a machine, such that the instructions which execute on the computer or other programmable apparatus create means for implementing the functions specified in the flowchart block(s) or step(s). As will be appreciated, any such computer program instructions may also be stored in a computer-readable memory that can direct a computer or other programmable apparatus (i.e., hardware) to function in a particular manner, such that the instructions stored in the computer-readable memory produce an article of manufacture including instruction means which implement the function specified in the flowchart block(s) or step(s). The computer program instructions may also be loaded onto a computer or other programmable apparatus to cause a series of operational steps to be performed on the computer or other programmable apparatus to produce a computer implemented process such that the instructions which execute on the computer or other programmable apparatus provide steps for implementing the functions specified in the flowchart block(s) or step(s).

Accordingly, blocks or steps of the flowchart support combinations of means for performing the specified functions, combinations of steps for performing the specified functions and program instruction means for performing the specified functions. It will also be understood that one or more blocks or steps of the flowchart, and combinations of blocks or steps in the flowchart, can be implemented by special purpose hardware-based computer systems which perform the specified functions or steps, or combinations of special purpose hardware and computer instructions.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

What is claimed is:

1. An apparatus comprising a processor and a memory storing executable instructions that in response to execution by the processor cause the apparatus to at least perform the following:

processing data during a connection between the apparatus and another apparatus, the data being processed in accordance with a predetermined coding scheme;

selecting or receiving a selection of feedback code information during the connection, the feedback code information comprising information from which a parity-check matrix is constructable, the feedback code information comprising one of a seed parity-check matrix, an exponent matrix, an index of a parity-check-matrix-related permutation matrix, or an index of an exponent-matrix-related permutation matrix; and switching the processing of data to process the data during at least a portion of the connection in accordance with a parity-check coding technique based upon the feedback code information.

2. An apparatus according to claim 1, wherein processing data comprises encoding at least one sequence received by the apparatus during the connection between the apparatus and the other apparatus, and wherein selecting or receiving a selection comprises receiving a selection of feedback code information from the other apparatus, the other apparatus being configured to decode data in accordance with a predetermined coding scheme, select the feedback code information and switch the decoding of data in accordance with a parity-check coding technique based upon the feedback code information.

3. An apparatus according to claim 1, wherein processing data comprises decoding at least one block code received by the apparatus during the connection between the apparatus and the other apparatus, and wherein selecting or receiving a selection comprises selecting feedback code information and preparing the feedback code information for transmission to the other apparatus, the other apparatus being configured to encode data in accordance with a predetermined coding scheme, receive the selected feedback code information and switch the encoding of data in accordance with a parity-check coding technique based upon the feedback code information.

4. An apparatus according to claim 1, wherein selecting or receiving a selection comprises selecting or receiving a selection of feedback code information selected based upon at least one parameter having a relationship to a parity-check matrix with which the data is processable.

5. An apparatus according to claim 1, wherein processing data in accordance with a predetermined coding scheme comprises passing the data without processing the data.

6. An apparatus according to claim 1, wherein processing data in accordance with a predetermined coding scheme comprises processing the data in accordance with a second coding technique different from the parity-check coding technique.

7. An apparatus according to claim 1, wherein processing data in accordance with a predetermined coding scheme comprises processing the data in accordance with the parity-check coding technique based upon predefined code information different from the feedback code information.

8. An apparatus comprising:
a first means for processing data during a connection between the apparatus and another apparatus, the data being processed in accordance with a predetermined coding scheme;
a second means for selecting or receiving a selection of feedback code information during the connection, the feedback code information comprising information from which a parity-check matrix is constructable, the feedback code information comprising one of a seed parity-check matrix, an exponent matrix, an index of a parity-check-matrix-related permutation matrix, or an index of an exponent-matrix-related permutation matrix; and
a third means for switching the processing step to process data during at least a portion of the connection in accordance with a parity-check coding technique based upon the feedback code information.

9. An apparatus according to claim 8, wherein the first means is for one of encoding at least one sequence received by an error correction encoder, or decoding at least one block code received by an error correction decoder, during the connection.

10. An apparatus according to claim 8, wherein the second means is for selecting or receiving a selection of feedback code information selected based upon at least one parameter having a relationship to a parity-check matrix with which the data is processable.

11. An apparatus according to claim 8, wherein the first means being for processing data in accordance with a predetermined coding scheme includes being for passing the data without processing the data.

12. An apparatus according to claim 8, wherein the first means being for processing data in accordance with a predetermined coding scheme includes being for processing the data in accordance with a second coding technique different from the parity-check coding technique.

13. An apparatus according to claim 8, wherein the first means being for processing data in accordance with a predetermined coding scheme includes being for processing the data in accordance with the parity-check coding technique based upon predefined code information different from the feedback code information.

14. A method comprising:
processing data during a connection between an apparatus and another apparatus, the data being processed in accordance with a predetermined coding scheme;
selecting or receiving a selection of feedback code information during the connection, the feedback code information comprising information from which a parity-check matrix is constructable, the feedback code information comprising one of a seed parity-check matrix, an exponent matrix, an index of a parity-check-matrix-related permutation matrix, or an index of an exponent-matrix-related permutation matrix; and
switching the processing data to processing data during at least a portion of the connection in accordance with a parity-check coding technique based upon the feedback code information,
wherein processing data and switching the processing are performed by a processor configured to process the data and switch the processing.

15. A method according to claim 14, wherein processing data comprises one of encoding at least one sequence received by an error correction encoder, or decoding at least one block code received by an error correction decoder, during the connection.

16. A method according to claim 14, wherein selecting or receiving a selection comprises selecting or receiving a selection of feedback code information selected based upon at least one parameter having a relationship to a parity-check matrix with which the data is processable.

17. A method according to claim 14, wherein processing data in accordance with a predetermined coding scheme comprises passing the data without processing the data.

18. A method according to claim 14, wherein processing data in accordance with a predetermined coding scheme comprises processing the data in accordance with a second coding technique different from the parity-check coding technique.

19. A method according to claim 14, wherein processing data in accordance with a predetermined coding scheme comprises processing the data in accordance with the parity-check coding technique based upon predefined code information different from the feedback code information.

20. A computer program product comprising at least one computer-readable storage medium having computer-readable program code portions stored therein that in response to execution by a processor cause an apparatus to at least perform the following:

processing data during a connection between an apparatus and another apparatus, the data being processed in accordance with a predetermined coding scheme;

selecting or receiving a selection of feedback code information during the connection, the feedback code information comprising information from which a parity-check matrix is constructable, the feedback code information comprising one of a seed parity-check matrix, an exponent matrix, an index of a parity-check-matrix-related permutation matrix, or an index of an exponent-matrix-related permutation matrix; and switching the processing data to processing data during at least a portion of the connection in accordance with a parity-check coding technique based upon the feedback code information.

21. A computer program product according to claim 20, wherein processing data comprises one of encoding at least one sequence received by an error correction encoder, or decoding at least one block code received by an error correction decoder, during the connection.

22. A computer program product according to claim 20, wherein selecting or receiving a selection comprises selecting or receiving a selection of feedback code information selected based upon at least one parameter having a relationship to a parity-check matrix with which the data is processable.

23. A computer program product according to claim 20, wherein processing data in accordance with a predetermined coding scheme comprises passing the data without processing the data.

24. A computer program product according to claim 20, wherein processing data in accordance with a predetermined coding scheme comprises processing the data in accordance with a second coding technique different from the parity-check coding technique.

25. A computer program product according to claim 20, wherein processing data in accordance with a predetermined coding scheme comprises processing the data in accordance with the parity-check coding technique based upon predefined code information different from the feedback code information.

* * * * *

UNITED STATES PATENT AND TRADEMARK OFFICE
CERTIFICATE OF CORRECTION

| | | |
|---|---|---|
| PATENT NO. | : 7,689,892 B2 | Page 1 of 1 |
| APPLICATION NO. | : 11/574792 | |
| DATED | : March 30, 2010 | |
| INVENTOR(S) | : Stolpman et al. | |

It is certified that error appears in the above-identified patent and that said Letters Patent is hereby corrected as shown below:

Title page,

Insert the following:

Item -- Related U.S. Application Data

(60) Provisional application No. 60/608,287, filed on Sept. 8, 2004 --.

Signed and Sealed this
Twelfth Day of July, 2011

David J. Kappos
*Director of the United States Patent and Trademark Office*